(12) United States Patent
Cooney, III et al.

(10) Patent No.: US 7,863,180 B2
(45) Date of Patent: Jan. 4, 2011

(54) THROUGH SUBSTRATE VIA INCLUDING VARIABLE SIDEWALL PROFILE

(75) Inventors: Edward Crandal Cooney, III, Jericho, VT (US); Peter James Lindgren, Essex Junction, VT (US); Dorreen Jane Ossenkop, North Hudson, NY (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 127 days.

(21) Appl. No.: 12/115,564

(22) Filed: May 6, 2008

(65) Prior Publication Data

US 2009/0278237 A1  Nov. 12, 2009

(51) Int. Cl.
*H01L 21/4763* (2006.01)

(52) U.S. Cl. ................ 438/621; 438/618; 257/E23.011

(58) Field of Classification Search ................ 438/667, 438/640, 673, 675, 700, 621, 618, 648
See application file for complete search history.

(56) References Cited

U.S. PATENT DOCUMENTS

| | | | |
|---|---|---|---|
| 6,127,278 A | 10/2000 | Wang et al. | |
| 6,635,335 B1 | 10/2003 | Donohoe et al. | |
| 6,743,727 B2 * | 6/2004 | Mathad et al. | 438/695 |
| 6,787,052 B1 * | 9/2004 | Vaganov | 216/57 |
| 6,809,005 B2 | 10/2004 | Ranade et al. | |
| 6,943,109 B2 | 9/2005 | Ogasawara et al. | |
| 7,022,601 B2 | 4/2006 | Jung et al. | |
| 2004/0115929 A1 | 6/2004 | Lim | |
| 2004/0152295 A1 * | 8/2004 | Cooney et al. | 438/623 |
| 2005/0023702 A1 | 2/2005 | Nishimura et al. | |
| 2006/0046456 A1 | 3/2006 | An | |
| 2006/0046457 A1 | 3/2006 | Tanaka | |
| 2006/0252252 A1 | 11/2006 | Zhu et al. | |
| 2007/0026631 A1 | 2/2007 | Lin et al. | |
| 2008/0057724 A1 * | 3/2008 | Kiehlbauch et al. | 438/706 |
| 2008/0073752 A1 | 3/2008 | Asai et al. | |
| 2008/0290515 A1 | 11/2008 | Arunachalam et al. | |
| 2009/0230507 A1 | 9/2009 | Riess et al. | |

OTHER PUBLICATIONS

International Search Report dated Jun. 29, 2009.

* cited by examiner

*Primary Examiner*—Chuong A. Luu
*Assistant Examiner*—Nga Doan
(74) *Attorney, Agent, or Firm*—Scully, Scott, Murphy & Presser, P.C.; Richard M. Kotulak, Esq.

(57) ABSTRACT

A microelectronic structure, such as a semiconductor structure, and a method for fabricating the microelectronic structure, include an aperture within a substrate. Into the aperture is located and formed a via. The via may include a through substrate via. The aperture includes, progressing sequentially contiguously at least partially through the substrate: (1) a first comparatively wide region at a surface of the substrate; (2) a constricted region contiguous with the first comparatively wide region; (3) a second comparatively wide region contiguous with the constricted region; and (4) a tapered region contiguous with the second comparatively wide region. The structure of the aperture provides for ease in filling the aperture, as well as void isolation within the via that is filled into the aperture.

13 Claims, 5 Drawing Sheets

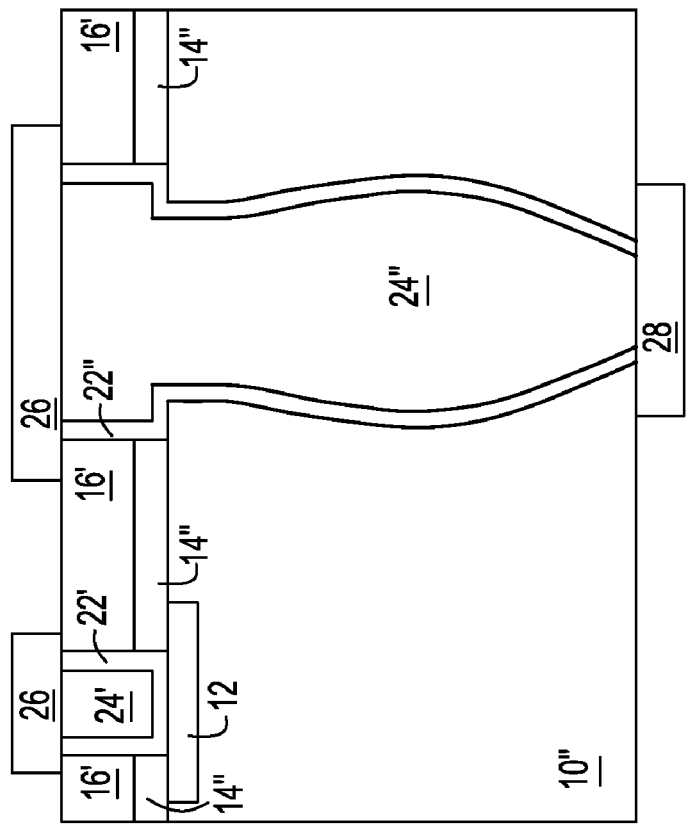
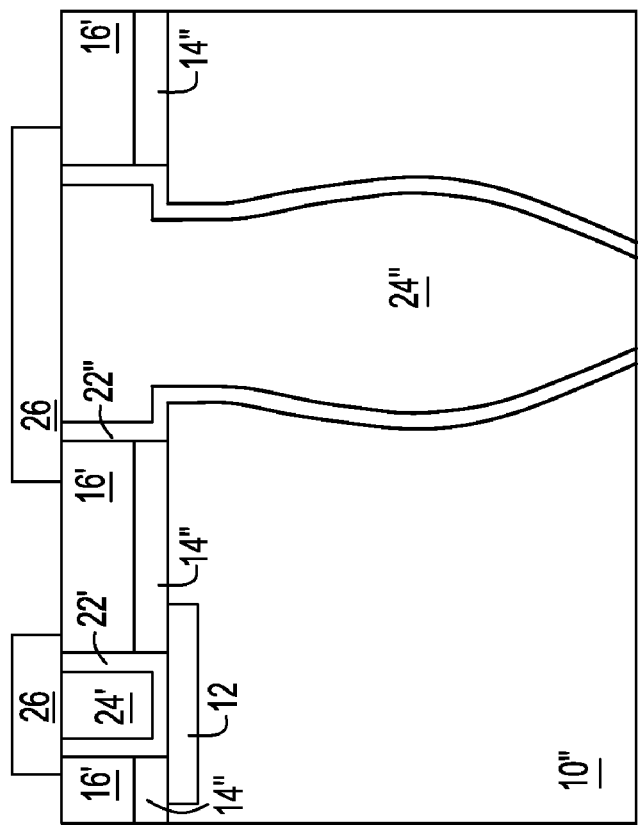
FIG. 10
FIG. 9

THROUGH SUBSTRATE VIA INCLUDING VARIABLE SIDEWALL PROFILE

BACKGROUND

1. Field of the Invention

The invention relates generally to through substrate vias within microelectronic substrates. More particularly, the invention relates to enhanced performance through substrate vias within microelectronic substrates.

2. Background of the Invention

Microelectronic structures, and in particular semiconductor structures, include microelectronic devices such as semiconductor devices. The microelectronic devices are located and formed over a microelectronic substrate, such as a semiconductor substrate. The microelectronic devices are connected and interconnected using patterned conductor layers that are separated by dielectric layers.

In addition to the connection and interconnection of microelectronic devices within a microelectronic structure while using patterned conductor layers that are separated by dielectric layers, microelectronic structures, and in particular semiconductor structures, also frequently use through substrate via structures that provide an electrical connection from a top side to a bottom side of a microelectronic substrate, such as a semiconductor substrate.

Through substrate vias when used within microelectronic substrates may serve functions that include, but are not necessarily limited to, microelectronic substrate grounding functions and microelectronic substrate electrical biasing functions.

While through substrate vias within microelectronic substrates serve valuable functions, through substrate vias within microelectronic substrates are not entirely without problems. In particular, through substrate vias are often difficult to efficiently fabricate and effectively fill with a comparatively narrow linewidth (i.e., in a range from about 5 to about 0.1 microns), while substantially or completely penetrating through a microelectronic substrate having an increased thickness.

Various aspects of vias in general, potentially including but not limited to through substrate vias, are known in the microelectronic fabrication art.

For example, Jang et al., in U.S. Pub. No. 2001/0007797, teaches a method for forming a tungsten via over a titanium containing barrier layer within a contact aperture to form a contact structure within a semiconductor structure absent delamination of the contact structure. The method includes forming and annealing a tungsten seed layer, while using a fluorine containing source gas, over the titanium containing barrier layer prior to forming the tungsten via over the titanium containing barrier layer.

In addition, Lim in U.S. Pub. No. 2004/0115929, teaches a method for forming a tungsten via within a contact aperture within a semiconductor structure with enhanced step coverage. The method includes first forming within the contact aperture a tungsten nitride barrier layer while using an atomic layer deposition (ALD) method.

Further, Nishimura et al., in U.S. Pub. No. 2005/0023702, teaches a method for forming a tungsten via within a contact aperture within a semiconductor structure, absent a void within the tungsten via. The method includes a two-step deposition of the tungsten via, where the crystal grains within the tungsten deposited within the first step are 30 nm or less.

Still further, Ogasawara et al., in U.S. Pat. No. 6,943,109, teaches a method for forming a tungsten via within an aperture within a semiconductor structure with comparatively low resistance and high reliability. The method includes treating the aperture with a fluorine containing gas prior to filling the aperture with the tungsten via.

Still yet further, An, in U.S. Pub. No. 2006/0046456, teaches a dual damascene method for forming a dual damascene structure with enhanced performance within a semiconductor structure. The dual damascene structure includes a tungsten via within a via portion of the dual damascene structure and a copper interconnect within an interconnect portion of the dual damascene aperture.

Yet still further, Tanaka, in U.S. Pub. No. 2006/0046457, teaches a method for forming a tungsten via within an aperture within a semiconductor structure. The method uses a post deposition purge of fluorine from a tungsten via deposited using a tungsten fluoride deposition material.

In addition, Jung et al., in U.S. Pat. No. 7,022,601, teaches a method for forming a tungsten via within an aperture within a semiconductor structure absent defects. The method uses a barrier layer comprising a tungsten-silicon-nitride material deposited prior to the tungsten via.

Finally, Zhu et al., in U.S. Pub. No. 2006/0252252, teaches a method for forming a contact layer contacting a tungsten via with enhanced performance within a semiconductor structure. The method provides for first cleaning a tungsten oxide from the tungsten via prior to forming the contact layer contacting the tungsten via.

The use of through substrate vias is likely to be of continued prominence and importance as microelectronic device and microelectronic structure dimensions decrease, and as microelectronic circuit functionality and performance requirements increase. To that end, desirable are through substrate via structures having enhanced performance, and methods for fabricating those through substrate via structures.

SUMMARY

The invention includes a microelectronic structure and a method for fabricating the microelectronic structure. The microelectronic structure includes an aperture located within a substrate, into at least a part of which aperture is located and formed a through substrate via incident to appropriate processing of the substrate. The aperture and the through substrate via include a particular sidewall profile. The particular sidewall profile includes, downwardly progressing through the substrate: (1) a first comparatively wide region at a surface of the substrate; (2) a constricted region contiguous with the first comparatively wide region; (3) a second comparatively wide region contiguous with the constricted region; and (4) an inward tapered region contiguous with the second comparatively wide region. The foregoing sidewall profile provides for ease in filling the via into the aperture, while providing for desirable geometric localization of any voids that form when filling the via into the aperture.

A particular microelectronic structure in accordance with the invention includes a substrate including an aperture at least partially through the substrate. The aperture includes, progressing at least partially through the substrate: (1) a first comparatively wide region at a surface of the substrate; (2) a constricted region contiguous with the first comparatively wide region; (3) a second comparatively wide region contiguous with the constricted region; and (4) an inward tapered region contiguous with the second comparatively wide region.

Another particular microelectronic structure in accordance with the invention includes a semiconductor substrate including an aperture at least partially through the semiconductor substrate. The aperture includes, progressing at least partially through the semiconductor substrate: (1) a first comparatively wide region at a surface of the semiconductor substrate; (2) a constricted region contiguous with the first comparatively wide region; (3) a second comparatively wide region contiguous with the constricted region; and (4) an inward tapered region contiguous with the second comparatively wide region. The microelectronic structure also includes a via located within the aperture.

A particular method for fabricating a microelectronic structure in accordance with the invention includes forming an aperture at least partially through a substrate. The aperture includes: (1) a first comparatively wide region at a surface of the substrate; (2) a constricted region contiguous with the first comparatively wide region; (3) a second comparatively wide region contiguous with the constricted region; and (4) a tapered region contiguous with the second comparatively wide region. This particular method also includes forming a via into the aperture.

BRIEF DESCRIPTION OF THE DRAWINGS

The objects, features and advantages of the invention are understood within the context of the Description of the Preferred Embodiment, as set for the below. The Description of the Preferred Embodiment is understood within the context of the accompanying drawings, that form a material part of this disclosure wherein:

FIG. 1 to FIG. 10 show a series of schematic cross-sectional diagrams illustrating the results of progressive stages in fabricating a microelectronic structure in accordance with a particular embodiment of the invention.

DESCRIPTION OF THE PREFERRED EMBODIMENT

The invention, which includes a microelectronic structure and a method for fabricating the microelectronic structure, is understood within the context of the description set forth below. The description set forth below is understood within the context of the drawings described above. Since the drawings are intended for illustrative purposes, the drawings are not necessarily drawn to scale.

Figure 1:
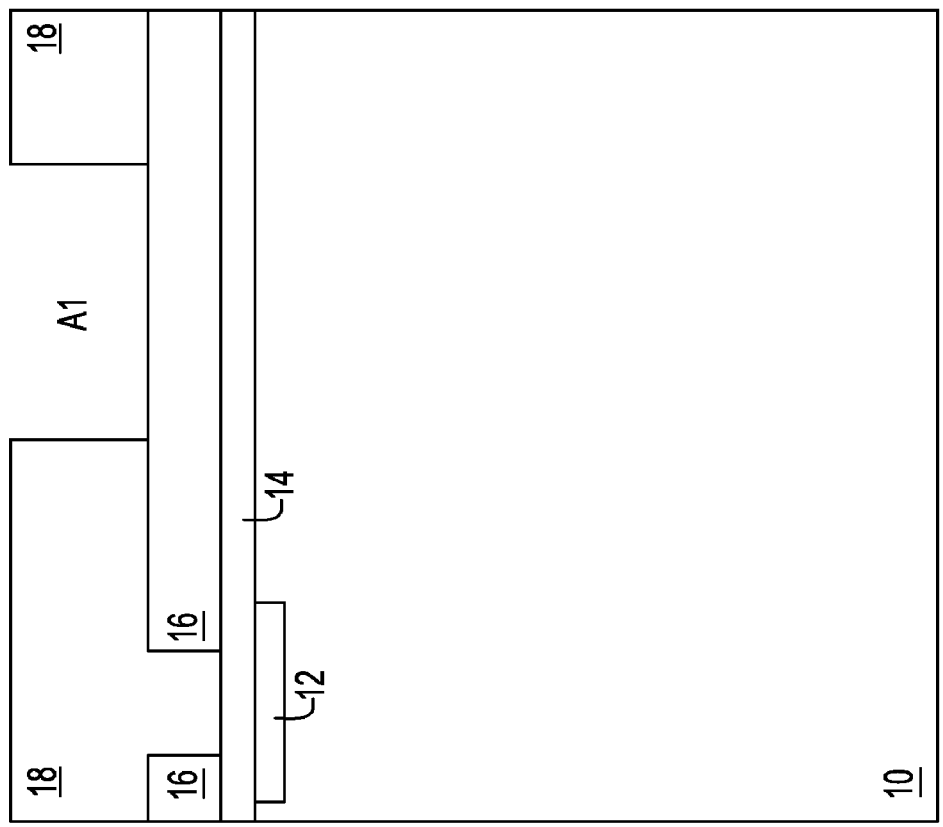

FIG. 1 to FIG. 10 show a series of schematic cross-sectional diagrams illustrating the results of progressive stages in fabricating a microelectronic structure in accordance with a particular embodiment of the invention. This particular embodiment of the invention comprises a sole preferred embodiment of the invention. FIG. 1 shows a schematic cross-sectional diagram of the microelectronic structure at an early stage in the fabrication thereof in accordance with the particular sole preferred embodiment.

FIG. 1 shows a semiconductor substrate 10 that includes a contact region 12 located within the semiconductor substrate 10. An etch stop layer 14 is located upon the semiconductor substrate 10 including the contact region 12. A capping layer 16 is located upon the etch stop layer 14. The capping layer 16 includes an aperture therein located above the contact region 12. A first photoresist layer 18 is located upon exposed portions of the etch stop layer 14 and the capping layer 16. The first photoresist layer 18 includes an aperture A1 located over a portion of the substrate 10 that does not include the contact region 12. Each of the foregoing semiconductor substrate 10 and overlying regions and layers 12/14/16/18 may comprise materials, have dimensions and be formed using methods that are otherwise generally conventional in the microelectronic fabrication art.

The semiconductor substrate 10 may comprise any of several semiconductor materials that are otherwise generally conventional in the semiconductor fabrication art. Non-limiting examples include silicon, germanium silicon-germanium alloy, silicon-carbon alloy, silicon-germanium-carbon alloy and compound semiconductor materials. Non-limiting examples of compound semiconductor materials include gallium arsenide semiconductor materials, indium arsenide semiconductor materials and indium phosphide semiconductor materials.

Although this particular preferred embodiment illustrates the invention within the context of a semiconductor substrate 10 that is most generally illustrated as a bulk semiconductor substrate, neither the embodiment nor the invention is necessarily intended to be so limited. Rather the embodiment and the invention also contemplate the use of a semiconductor-on-insulator substrate or a hybrid orientation substrate as the semiconductor substrate 10, in place of a bulk semiconductor substrate.

A semiconductor-on-insulator substrate results from inclusion of a buried dielectric layer interposed between a base semiconductor substrate portion and a surface semiconductor layer portion of the semiconductor substrate 10 that is illustrated in FIG. 1. A hybrid orientation substrate includes multiple crystallographic orientation semiconductor regions supported over a single substrate, that typically comprises a semiconductor substrate.

Semiconductor-on-insulator substrates and hybrid orientation substrates may be fabricated using methods that are generally conventional in the semiconductor fabrication art. Included in particular, but not necessarily limiting, are layer transfer methods, layer laminating methods and separation by implantation of oxygen methods.

The contact region 12 may comprise any of several contact materials. Non-limiting examples include semiconductor contact materials as well as conductor contact materials. Semiconductor contact materials may include any of several semiconductor materials that are doped appropriately and adequately to serve as contact regions. Conductor contact materials may include, but are not necessarily limited to metals, metal alloys, metal silicides and metal nitrides. Generally, the contact region 12 comprises a semiconductor contact material such as but not limited to a silicon semiconductor contact material, that has a thickness from about 1 to about 100 nanometers.

Although the instant embodiment illustrates the invention within the context of the semiconductor substrate 10 including the contact region 12, the embodiment is also not specifically limited to only a contact region within a semiconductor substrate. Rather, the embodiment also contemplates that the semiconductor substrate 10 will also include located and formed therein semiconductor devices that are appropriate for a semiconductor circuit which is intended to be fabricated within and upon the semiconductor substrate 10. Such semiconductor devices may include, but are not necessarily limited to, resistors, transistors, diodes and capacitors.

Further, while the instant embodiment again illustrates the invention within the context of a semiconductor substrate 10 that is most generally illustrated as a bulk semiconductor substrate, neither the embodiment nor the invention is intended to necessarily be limited to a microelectronic structure that is limited to a semiconductor substrate as a base substrate. Rather the embodiment and the invention also contemplate applicability within the context of base substrates such as but not limited to ceramic substrates. Such ceramic substrates may comprise materials including but not limited to silica, alumina, titania and zirconia ceramic materials.

The etch stop layer 14 comprises an etch stop material. The etch stop material is chosen within the context of a material of composition of the capping layer 16 that is located and formed upon the etch stop layer 14. The etch stop layer 14 will typically comprise a dielectric etch stop material, to adequately isolate conductor structures that are formed incident to further processing of the semiconductor structure that is illustrated in FIG. 1. Candidate dielectric etch stop materials include, but are not necessarily limited to silicon oxide materials, silicon nitride materials and silicon oxynitride materials. Oxides, nitrides and oxynitrides of other elements are not excluded. The etch stop material may also be formed using methods that are generally conventional in the semiconductor fabrication art. Included in particular, but also not limiting are thermal or plasma oxidation or nitridation methods, chemical vapor deposition methods and physical vapor deposition methods. Typically, the etch stop layer 14 comprises a silicon nitride etch stop material that has a thickness from about 1 to about 100 nanometers.

The capping layer 16 may comprise any of several capping materials, which are generally intended as comprising any of the several dielectric materials from which may be comprised the etch stop layer 14. However, for proper etch stop properties of the etch stop layer 14, the etch stop layer 14 and the capping layer 16 must comprise different dielectric materials. When the etch stop layer 14 comprises a silicon nitride material as disclosed above, the capping layer 16 often comprises a silicon oxide material that has a thickness from about 10 to about 2,500 nanometers.

The first photoresist layer 18 may comprise any of several photoresist materials that may be deposited and imaged using otherwise generally conventional coating, photoexposure and development methods that are known in the semiconductor fabrication art. Such photoresist materials may in general include, but are not necessarily limited to, positive photoresist materials, negative photoresist materials and hybrid photoresist materials that have properties of both positive photoresist materials and negative photoresist materials. Typically, the first photoresist layer 18 comprises a positive photoresist material or a negative photoresist material that has a thickness from about 100 to about 2000 nanometers. As is illustrated in FIG. 1, the first photoresist layer 18 also defines an aperture A1 having a linewidth from about 0.5 to about 50 microns.

Figure 2:
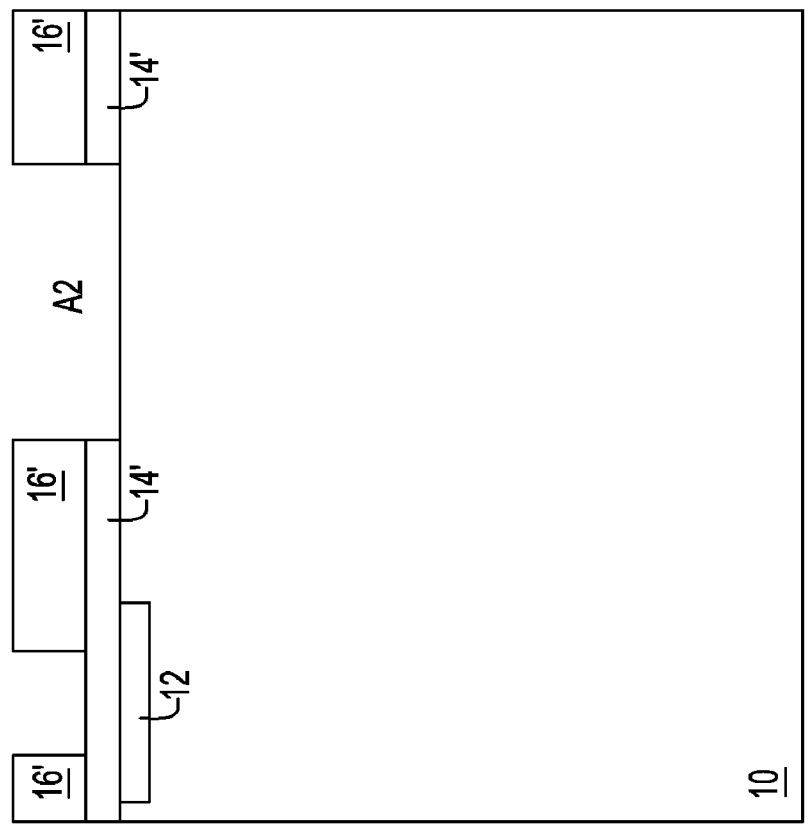

FIG. 2 first shows the results of etching the capping layer 16 and the etch stop layer 14, while using the photoresist layer 18 as a mask, to leave exposed a portion of the semiconductor substrate 10 within an aperture A2 that is defined by an etch stop layer 14' and a capping layer 16' that are formed from the etch stop layer 14 and the capping layer 16. FIG. 2 also shows the results of stripping the first photoresist layer 18 from the resulting etched semiconductor structure to provide the semiconductor structure whose schematic cross-sectional diagram is illustrated in FIG. 2.

The foregoing etching of the capping layer 16 and the etch stop layer 14 to provide the capping layer 16' and the etch stop layer 14' may be effected using etch methods and materials that are otherwise generally conventional in the semiconductor fabrication art. Generally included are wet chemical etch methods and materials, and dry plasma etch methods and materials. Dry plasma etch methods and materials are generally preferred insofar as dry plasma etch methods and materials provide generally straight sidewalls to the etch stop layer 14' and the capping layer 16' that provides the aperture A2. In addition, certain compositions of fluorine containing plasma etch methods may be used for sequentially etching non-selectively silicon containing dielectric materials, such as silicon oxide dielectric materials, silicon nitride dielectric materials and silicon oxynitride dielectric materials.

Subsequent to etching the capping layer 16 and the etch stop layer 14 to form the capping layer 16' and the etch stop layer 14', the first photoresist layer 18 may be stripped using stripping methods and materials that are also otherwise generally conventional in the semiconductor fabrication art. Included in particular are wet chemical stripping methods and materials, dry plasma stripping methods and materials and combinations of wet chemical stripping methods and materials and dry plasma stripping methods and materials.

Figure 3:
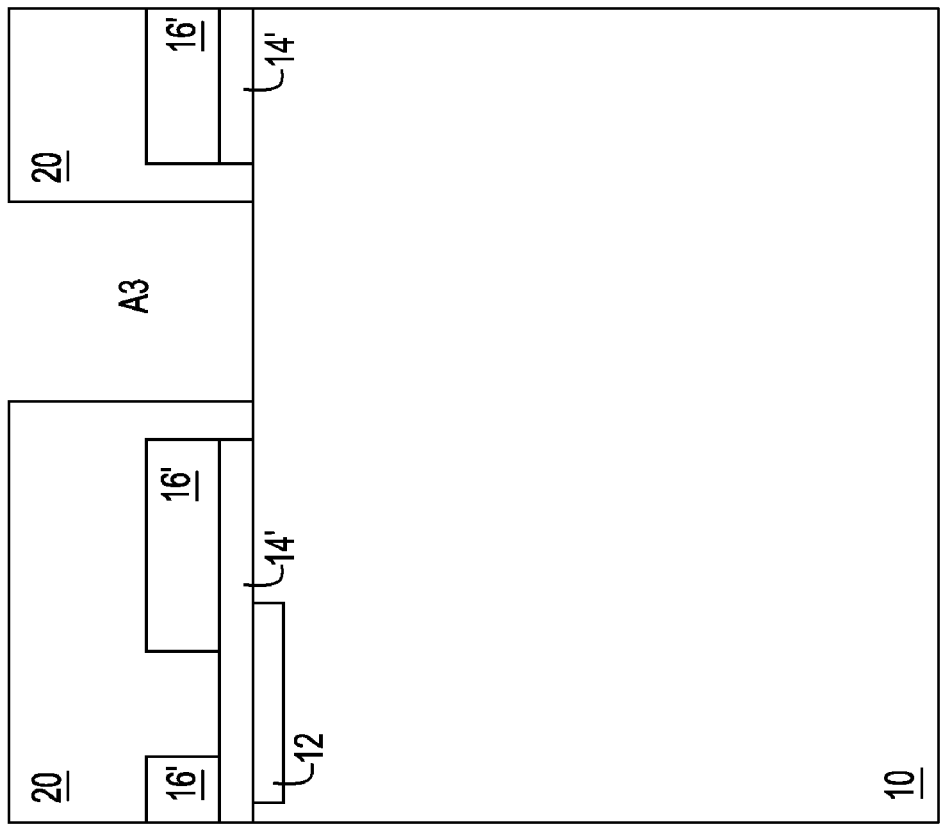

FIG. 3 shows a second photoresist layer 20 located and formed upon the semiconductor structure of FIG. 2. The second photoresist layer 20 forms an aperture A3 at the bottom of which is exposed a portion of the semiconductor substrate 10 that is fully exposed within the second aperture A2 that his defined by the etch stop layer 14' and the capping layer 16' that are illustrated in FIG. 2. This aperture A3 typically has a linewidth from about 0.4 to about 40 microns.

The second photoresist layer 20 may otherwise comprise materials, have a thickness and be formed using methods that are generally conventional in the semiconductor fabrication art, and described in further detail above within the context of the first photoresist layer 18 that is illustrated in FIG. 1.

Figure 4:
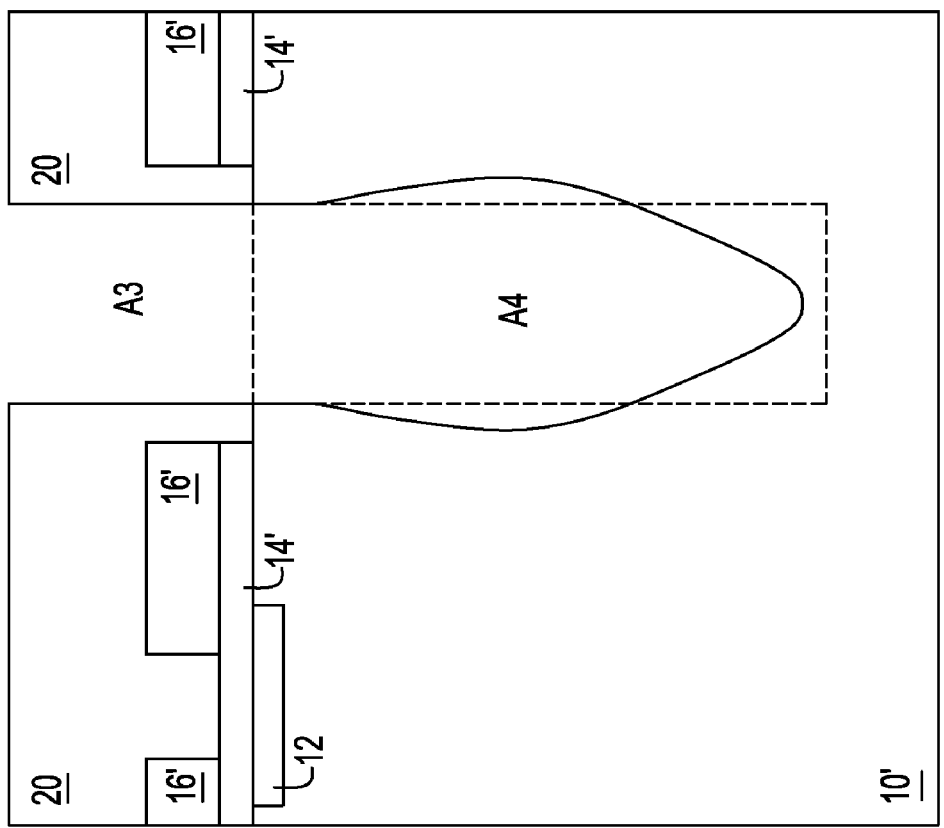

FIG. 4 shows an aperture A4 that is etched into a semiconductor substrate 10' derived from the semiconductor substrate 10 that is illustrated in FIG. 3, while using the second photoresist layer 20 as a mask. As is illustrated within the schematic cross-sectional diagram of FIG. 4, the aperture A4 is formed with a downward pointing torpedo shape. Within FIG. 4, the phantom lines correspond with a theoretical straight sided aperture that may alternatively be formed into the semiconductor substrate 10' while using the second photoresist layer 20 as an etch mask. As is illustrated in FIG. 4, the aperture A4 is wider at the widest point thereof in comparison with the theoretical straight sided aperture and narrower at the inward pointed tip thereof in comparison with the theoretical straight sided aperture.

In order to provide the aperture A4 whose schematic cross-sectional diagram is illustrated in FIG. 4 within the semiconductor substrate 10' that is illustrated in FIG. 4, this particular embodiment uses a particular two-step etch method. The particular two-step etch method sequentially uses: (1) a comparatively isotropic first etch step that provides in general the widening of the aperture A4 at the center of the aperture A4; followed by (2) a comparatively anisotropic second etch step that intended as a deep silicon etch method that provides the depth to the aperture A4.

Within the context of the semiconductor substrate 10' when comprised of a silicon semiconductor material, the first etch step uses: (1) a reactor chamber pressure from about 0.04 to about 0.1 torr; (2) a radio frequency source power from about 2000 to about 3000 watts; (3) a substrate bias power from about 0 to about 100 watts; (4) a substrate temperature from about 0 to about 10 degrees centigrade; (5) a sulfur hexafluoride flow rate from about 300 to about 500 standard cubic centimeters per minute; and (6) an oxygen flow rate from about 30 to about 50 standard cubic centimeters per minute.

Within the first etch step, both an etch time (i.e., which will typically be about 15 seconds, but may vary) and the reactor chamber pressure will determine a sidewall outward bow component of the aperture A4. In addition, alternative etchant gas compositions may also be used within the first etch step, in comparison with the etchant gas composition disclosed above.

Within the context of the semiconductor substrate 10' when comprised of a silicon semiconductor material, the second etch step uses: (1) a reactor chamber pressure from about 0.04 to about 0.1 torr; (2) a radio frequency source power from about 1500 to about 2500 watts; (3) a substrate bias power from about 10 to about 250 watts; (4) a substrate temperature from about 0 to about 50 degrees centigrade; (5) a sulfur hexafluoride flow rate from about 250 to about 350 standard cubic centimeters per minute; and (6) an oxygen flow rate of from about 20 to about 35 standard cubic centimeters per minute.

Again, alternative etchant gas compositions may also be used within the second etch step, in comparison with the etchant gas composition disclosed above.

The foregoing second etch step is undertaken for a time period of about 3 to about 10 seconds that is sequentially and alternatively followed by a deposition step that uses: (1) a reactor chamber pressure from about 0.03 to about 0.05 torr; (2) a radio frequency source power from about 1500 to about 2000 watts; (3) a substrate bias power from about 0 to about 50 watts; (4) a substrate temperature from about 0 to about 50 degrees centigrade; and (5) an octafluorocyclobutane flow rate from about 200 to about 300 standard cubic centimeters per minute, for a time period from about 3 to about 7 seconds. The sequential and successive foregoing second etch step and deposition step may be undertaken for a total time from about 30 to about 90 minutes to provide a desired depth to the aperture A4.

Figure 5:
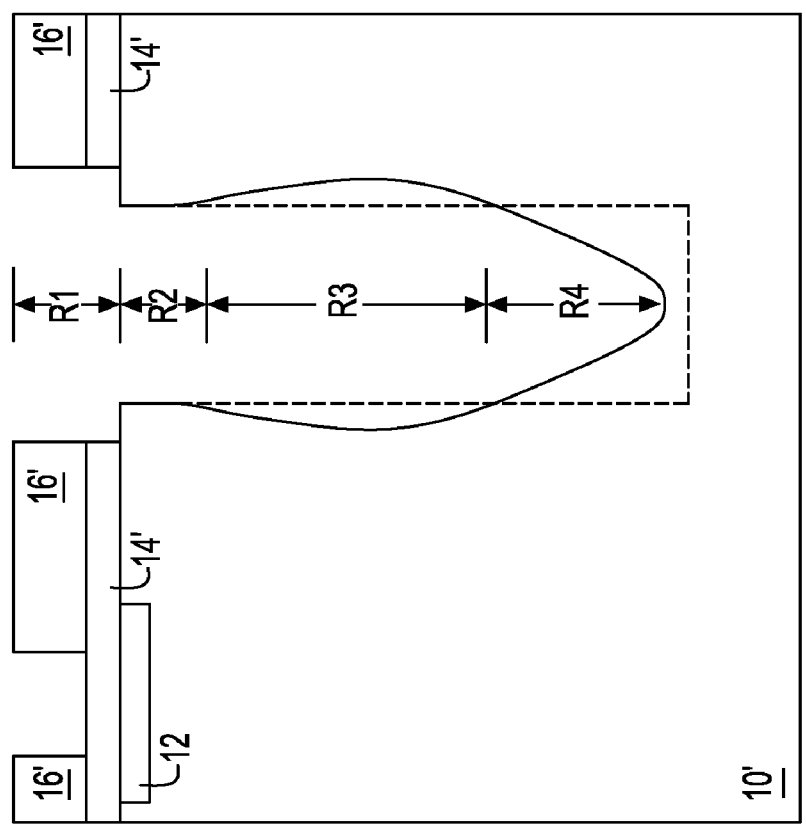

FIG. 5 first shows the results of stripping the second photoresist layer 20 from the semiconductor structure of FIG. 4. The second photoresist layer 20 may be stripped from the semiconductor structure of FIG. 4 to provide the semiconductor structure of FIG. 5 while using methods and materials that are otherwise generally conventional in the semiconductor fabrication art, and that are described above for fabricating the semiconductor structure of FIG. 2 from the semiconductor structure of FIG. 1.

As a result of stripping the second photoresist layer 20 from the semiconductor structure of FIG. 4 to form the semiconductor structure of FIG. 5, an extended aperture (i.e., a vertically extended aperture) is formed from the aperture A4 that is illustrated in FIG. 4. The extended aperture includes: (1) a first region R1 that is a first comparatively wide region having a linewidth from about 3 to about 50 microns defined by the capping layer 16' and the etch stop layer 14' and that extends a vertical distance from about 0.3 to about 10 microns; (2) a second region R2 that is a constricted region having a linewidth from about 1 to about 35 microns and a vertical distance from about 1 to about 30 microns; (3) a third region R3 that is a second comparatively wide region having a linewidth from about 3 to about 50 microns and a vertical distance from about 1 to about 200 microns; and (4) a fourth region having a generally but not necessarily pointed inward taper and a vertical distance from about 1 to about 100 microns. Each of the foregoing regions are sequentially contiguous and penetrating into the semiconductor substrate 10' in the order listed.

Within the instant embodiment, the comparatively wide linewidth of the first region R1, the comparatively wide linewidth of the third region R3 and the inward pointed taper of the fourth region R4 in general are intended to provide for ease in filling the extended aperture. In addition, the constriction within the second region R2 is intended to completely seal off any void that may form within the third region R3, and to localize that void to the third region R3.

Within the disclosed embodiment, sidewall portions of the third region R3 may have the substantially bowed sidewalls as illustrated (i.e., no portion of the sidewalls is aligned in a straight line). Alternatively, sidewall portions of the third region R3 may have substantially straight sidewalls (i.e., all portions of the sidewalls are aligned in a straight line).

In addition, the inward taper within the fourth region R4 may be pronounced and provide the pointed tip as is illustrated in FIG. 5. Alternatively, the inward taper within the fourth region R4 may be less pronounced to provide a blunt tip within the fourth region.

Within the preferred embodiment, the linewidth of the third region R3 is preferably greater than the linewidth of the first region R1 which in turn is preferably greater than the linewidth of the fourth region R4. In addition the linewidth of the first region R1 is preferably at least 1.5 times (and more preferably from about 1.3 to about 1.5 times) the linewidth of the fourth region R4, and the linewidth of the second region R2 is no greater than about 0.9 times (and preferably from about 0.8 to about 0.95 times) the linewidth of the first region R1. Finally, the linewidth of the fourth region R4 is preferably about 0.1 to about 2.0 times a deposition thickness of a conductor layer that is deposited and formed into the extended aperture incident to further processing of the semiconductor structure that is illustrated in FIG. 5 (i.e., illustrated as conductor layer 24 within FIG. 6).

Figure 6:
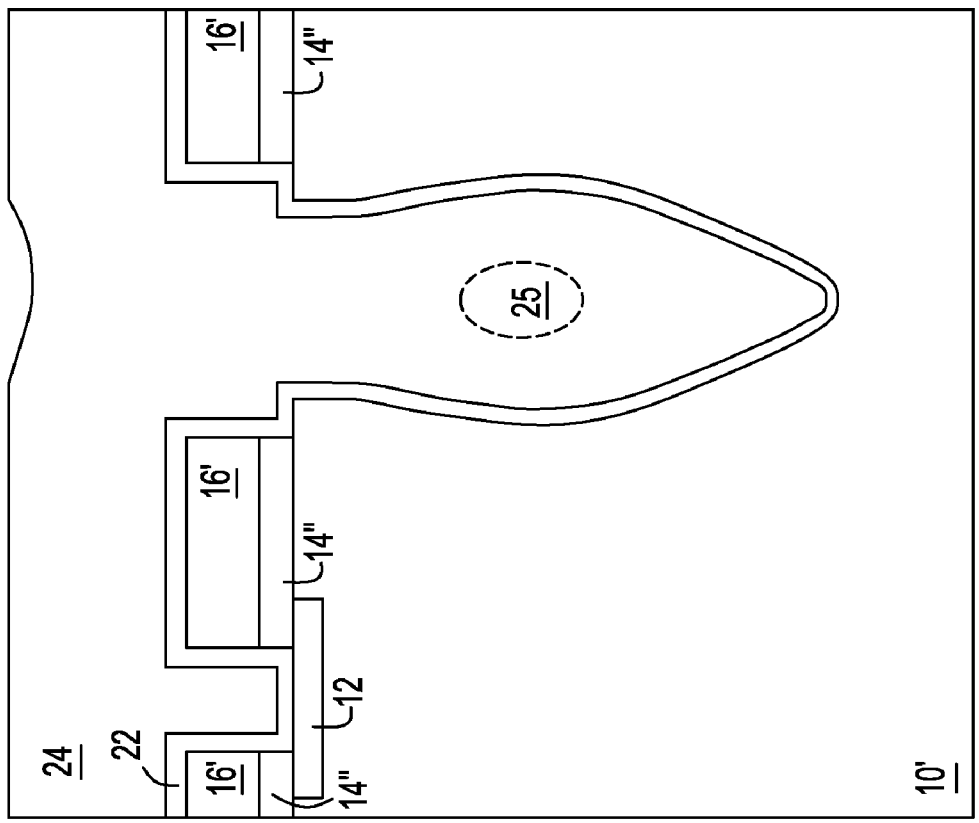

FIG. 6 shows a liner layer 22 located and formed conformally upon the semiconductor structure of FIG. 5 and incompletely filling the extended aperture. FIG. 6 also shows a conductor layer 24 with an optional void 25 located therein, located and formed upon the liner layer 22 and completely filling the extended aperture.

Depending the nature, design and intended use of the semiconductor structure whose schematic cross-sectional diagram is illustrated in FIG. 6, the liner layer 22 may comprise either a conductor liner material or a dielectric liner material. Dielectric liner materials may in general be selected from the same group of dielectric materials, and be formed using the same methods and materials, as the etch stop layer 14 or the capping layer 16 that are illustrated in FIG. 1.

The use of a conductor material for the liner layer 22 is desirable under circumstances where grounding of substantial portions of the semiconductor substrate 10' is desirable. Conductor materials for the liner layer 22 may be selected from the group including but not limited to certain metals, metal alloys, metal nitrides and metal silicides. Metal alloys, metal nitrides and metal silicides may under certain circumstances correspond with particular metals from which may be comprised the conductor layer 24.

While by no means intended as limiting the embodiment or the invention, a conductor material from which may be comprised the liner layer 22 may be a silicide material. As a further example, a tungsten silicide material may be used as a liner layer 22 for a conductor layer 24 that comprises a tungsten material. Such a tungsten silicide material may be deposited with enhanced adhesion using an atomic layer chemical vapor deposition method that in turn uses a tungsten hexafluoride tungsten source material and a silane silicon source material. Typically, the liner layer 22 is formed to a thickness from about 1 to about 50 nanometers.

The conductor layer 24 comprises a conductor material. While in accordance with disclosure above the conductor layer 24 may comprise any of several conductor materials, including but not limited to any of several metals and metal alloys, the conductor layer 24 typically comprises a tungsten material. Such a tungsten material is preferably deposited using a chemical vapor deposition method, although neither the embodiment nor the invention is so limited.

As is illustrated by the phantom line enclosure within the schematic diagram of FIG. 6, the conductor layer 24 may be deposited or formed with a void 25, but due to the irregular sidewall curvature of the extended aperture, the void 25 is localized to the second comparatively wide region R3 of the extended aperture.

Figure 7:
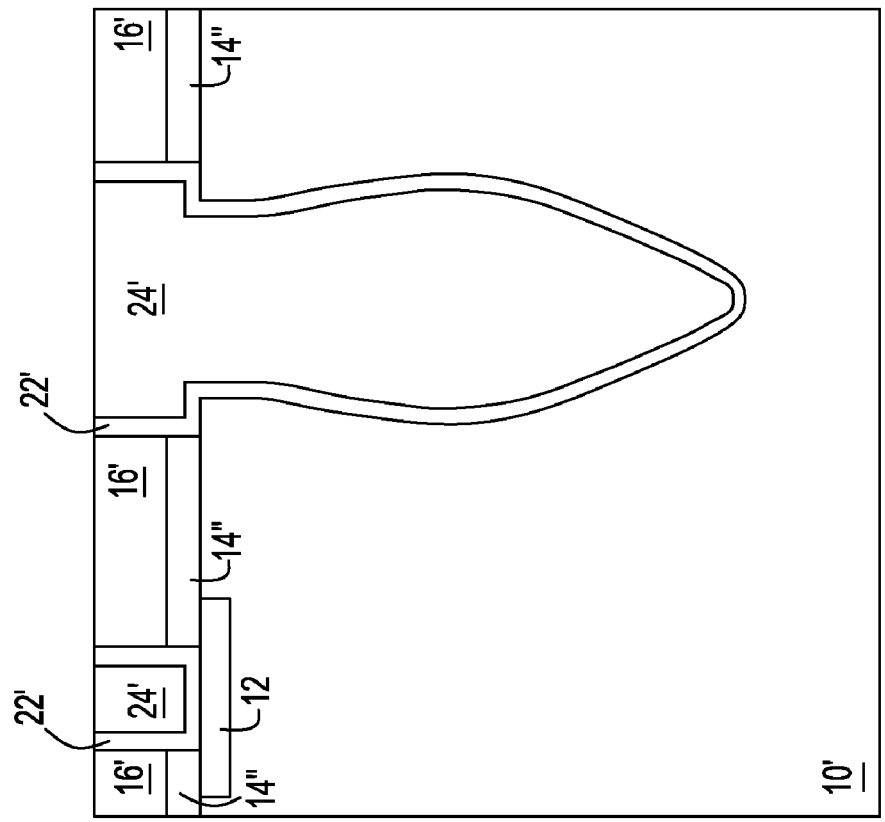

FIG. 7 shows the results of planarizing the semiconductor structure of FIG. 6 to provide a plurality of liner layers 22'; one contacting the contact region 12 and another penetrating into the semiconductor substrate 10'. The planarizing of the semiconductor structure of FIG. 6 to provide the semiconductor structure of FIG. 7 also provides a conductor layer 24' located and formed upon each liner layer 22'. The semiconductor structure of FIG. 6 may be planarized to form the semiconductor structure of FIG. 7 while using planarizing methods and materials that are otherwise generally conventional in the semiconductor fabrication art. Included in particular are mechanical planarizing methods and chemical mechanical polish planarizing methods. Chemical mechanical polish planarizing methods are generally more common.

Figure 8:
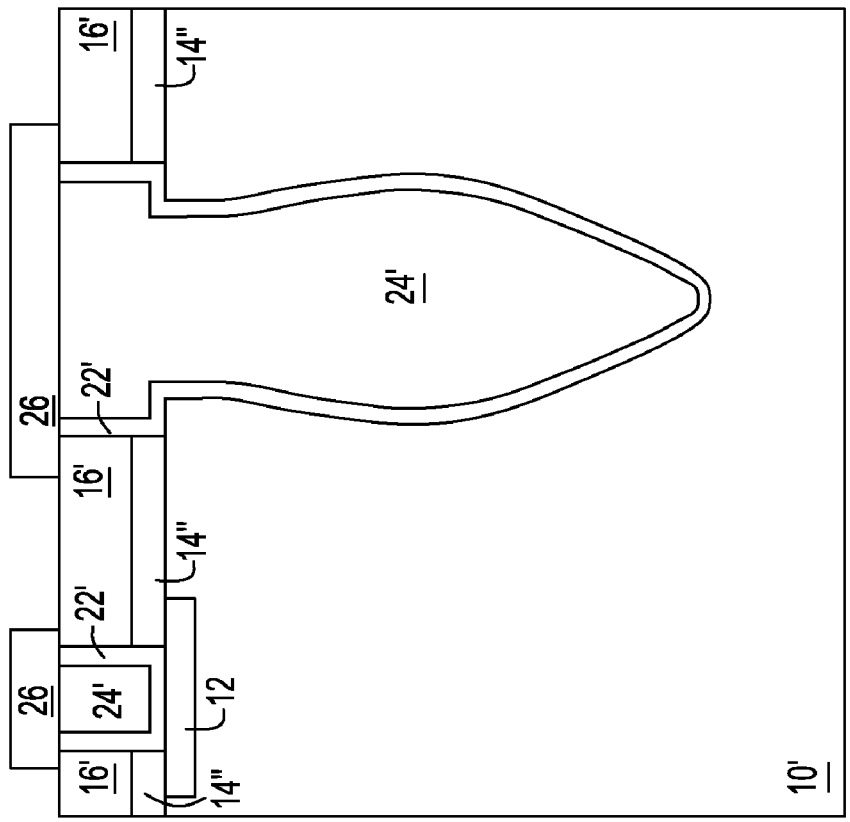

FIG. 8 shows a plurality of first interconnect layers 26 located and formed contacting the plurality of conductor layers 24'. The plurality of first interconnect layers 26 also comprise a conductor material that may generally be selected from the group including but not limited to metal, metal alloy, metal nitride and metal silicide conductor materials. Commonly, the plurality of first interconnect layers 26 comprise a copper interconnect material that has a thickness from about 300 to about 1000 nanometers, although neither the embodiment nor the invention is so limited. The plurality of first interconnect layers 26 may be formed using methods and materials that are otherwise generally conventional in the semiconductor fabrication art. Such methods include, but are not necessarily limited to, blanket layer deposition methods in conjunction with photolithographic and etch methods that are otherwise generally conventional in the semiconductor fabrication art.

FIG. 9 shows a semiconductor substrate 10", a liner layer 22" and a conductor layer 24" that result from a backside planarizing of the semiconductor substrate 10', the liner layer 22' and the conductor layer 24' that is illustrated in FIG. 8. Such a backside planarizing is intended to remove a thickness from about 0.1 to about 10 microns from the semiconductor substrate 10' while leaving exposed portions of both the liner layer 22" and the conductor layer 24". The foregoing backside planarizing may also be effected using methods that are otherwise generally conventional in the semiconductor fabrication art. Such methods may also include mechanical polish planarizing methods and chemical mechanical polish planarizing methods. However, given an amount of semiconductor material that is desired to be removed in forming the semiconductor substrate 10" from the semiconductor substrate 10', at least in part a mechanical polish planarizing method is used.

FIG. 10 shows a second interconnect layer 28 located and formed contacting an exposed bottom portion of the conductor layer 24". Such a second interconnect layer 28 may comprise materials, have dimensions and be formed using methods analogous, equivalent or identical to the materials, dimensions and methods used for fabricating the plurality of first interconnect layers 26 that is illustrated in FIG. 8.

FIG. 10 shows a schematic cross-sectional diagram of a semiconductor structure in accordance with a particular embodiment of the invention that comprises a first and sole preferred embodiment of the invention. The semiconductor structure includes a through substrate via 24" that penetrates from a front side of a semiconductor substrate 10" to a backside of the semiconductor substrate 10". The through substrate via 24" is located and formed into an aperture within the semiconductor substrate 10" of FIG. 10 that has an irregular sidewall profile. Progressing from the top surface to the bottom surface of the semiconductor structure that is illustrated in FIG. 10, the irregular sidewall aperture includes: (1) a first comparatively wide region laterally bounded by the capping layer 16' and the etch stop layer 14'; (2) a constricted region contiguous with and below the first comparatively wide region; (3) a second comparatively wide region contiguous with and below the constricted region; and (4) an inward tapered region contiguous with and below the second comparatively wide region.

Within this particular sole preferred embodiment, the first comparatively wide region of the aperture aids in efficiently filling the aperture with the through substrate via 24". The constricted region provides for surface closure of any voids that may form in the second comparatively wide region. The second comparatively wide region, due to the increase in linewidth thereof, provides for ease in filling the aperture. Finally, the inward tapered region allows for ease in filling at least a bottom portion of the aperture absent forming a void within the via that is filled into the aperture. While the instant embodiment illustrates the invention within the context of a single aperture and through substrate via 24" within a semiconductor substrate, a multiplicity of dimensionally similar or dimensionally identical apertures and corresponding vias may also be used within a single substrate, such as a single semiconductor substrate.

The preferred embodiment of the invention is illustrative of the invention rather than limiting of the invention. Revisions and modifications may be made to methods, materials, structures and dimensions of a semiconductor structure in accordance with the preferred embodiment, while still providing a microelectronic structure or a semiconductor structure in accordance with the invention, further in accordance with the accompanying claims.

What is claimed is:

1. A method for fabricating a microelectronic structure comprising:

forming at least one dielectric layer on a semiconductor substrate;

forming a first opening in the at least one dielectric layer to an underlying portion of the semiconductor substrate, wherein the first opening provides a first width portion of a via;

forming an etch mask having a second opening exposing a portion of the underlying portion of the semiconductor substrate, wherein the first opening has a greater width than the second opening;

extending the via with an isotropic etch into the semiconductor substrate to provide a second width portion and a third width portion, wherein a width of each of the second width portion and the third width portion are defined by etched semiconductor substrate sidewalls, the second width portion being narrower than the first width portion, the third width portion being wider than the second width portion and present at a greater depth of the semiconductor substrate than the second width portion;

anisotropically etching the via to a final depth having a fourth width portion defined by sidewalls of a final depth etched portion of the semiconductor substrate, wherein the fourth width portion is at a depth in the semiconductor substrate that is present at a depth that is greater than the third width portion and has a smaller width than the first width portion;

removing the etch mask; and filling the via with a conductive material.

2. The method of claim 1 wherein the isotropic etch uses an etch process only and the anisotropic uses an etch process and a deposition process.

3. The method of claim 2 wherein the etch process within the isotropic step and the etch process within the anisotropically etching step use the same etchant gas composition.

4. The method of claim 1 further comprising forming a liner layer onto the etched semiconductor substrate sidewalls, and on the sidewalls of the final depth etched portion of the semiconductor substrate prior to the filling the via with the conductive material.

5. The method of claim 4 wherein the liner layer and the conductive material comprise at least in part the same material.

6. The method of claim 4 wherein the liner layer is a conformal layer.

7. The method of claim 1 wherein the first width portion has a height from about 0.3 to about 10 microns above the surface of the semiconductor substrate; the second width portion has a depth ranging from about 1 to about 35 microns into the semiconductor substrate; the third width portion has a depth ranging from about 1 to about 200 microns into the semiconductor substrate; and the fourth depth portion has a depth ranging from about 1 to about 100 microns into the semiconductor substrate.

8. The method of claim 1 wherein the second width portion has a substantially straight sidewall.

9. The method of claim 1 wherein the third width portion has an outward bowed sidewall.

10. The method of claim 1 wherein the fourth width portion is tapered.

11. The method of claim 10 wherein the fourth width portion has a rounded base.

12. The method of claim 1 wherein a width of the first portion width is selected to facilitate filling of the via with the conductive material.

13. The method of claim 1 wherein a width of the second width portion is selected to provide a pinch off region during filling of the via with the conductive material, wherein the pinch off region obstructs the formation of a void at depths less in the substrate before the third width portion of the via.

* * * * *